(12) United States Patent
Guenther

(10) Patent No.: US 11,536,746 B2
(45) Date of Patent: Dec. 27, 2022

(54) TEST AND MEASUREMENT INSTRUMENT AND METHOD OF ANALYZING AN INPUT SIGNAL

(71) Applicant: Rohde & Schwarz GmbH & Co. KG, Munich (DE)

(72) Inventor: Thomas Guenther, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 73 days.

(21) Appl. No.: 16/915,018

(22) Filed: Jun. 29, 2020

(65) Prior Publication Data
US 2021/0405091 A1 Dec. 30, 2021

(51) Int. Cl.
*G01R 13/02* (2006.01)
(52) U.S. Cl.
CPC ................. *G01R 13/0254* (2013.01)
(58) Field of Classification Search
CPC G01R 13/0254; G01R 13/0218; G01R 13/02; G01R 13/00
See application file for complete search history.

(56) References Cited

U.S. PATENT DOCUMENTS

| | | | |
|---|---|---|---|
| 6,279,130 B1 | 8/2001 | Moser | |
| 2006/0015277 A1* | 1/2006 | Bernard | G01R 13/0254 702/76 |
| 2007/0226406 A1* | 9/2007 | Beale | G06F 5/14 711/110 |
| 2009/0228226 A1* | 9/2009 | Dobyns | G01R 13/0272 702/67 |
| 2015/0247883 A1* | 9/2015 | Schaefer | G01R 13/02 702/67 |

FOREIGN PATENT DOCUMENTS

EP 1837753 A2 9/2007

* cited by examiner

*Primary Examiner* — Mohamed Charioui
(74) *Attorney, Agent, or Firm* — Christensen O'Connor Johnson Kindness PLLC

(57) ABSTRACT

The disclosure relates to a test and measurement instrument. The test and measurement instrument comprises a digitizer for digitizing an analog input signal, thereby generating a digitized input signal. The test and measurement instrument also has a digital trigger for detecting a trigger event in the digitized input signal. The test and measurement instrument also comprises an acquisition memory for acquiring the digitized input signal at least segmentally upon a first trigger event detected by the digital trigger. The acquisition memory is configured to acquire a first signal segment prior to the first trigger event. The acquisition memory is further configured to acquire a second signal segment starting at the first trigger event. The length of the second signal segment is dynamically adjustable. Moreover, a method of analyzing an input signal by a test and measurement instrument is described.

18 Claims, 1 Drawing Sheet

TEST AND MEASUREMENT INSTRUMENT AND METHOD OF ANALYZING AN INPUT SIGNAL

FIELD OF THE DISCLOSURE

The present disclosure generally relates to a test and measurement instrument. Further, the present disclosure relates to a method of analyzing an input signal by a test and measurement instrument.

BACKGROUND

In the state of the art, different types of test and measurement instruments are known for analyzing an input signal provided by a device under test. Oscilloscopes correspond to a well-known type of test and measurement instruments. An oscilloscope can be operated in at least one of the two typical operation modes, namely a triggered operation mode as well as a continuous operation mode.

In the triggered operation mode, an acquisition of the input signal is triggered by a trigger event wherein a pre-trigger memory section of an acquisition memory as well as a post-trigger memory section of the acquisition memory are filled in order to acquire a signal portion of the input signal that encompasses the trigger event. In fact, the pre-trigger memory section as well as the post-trigger memory section ensure that data of the input signal is acquired that occurs before and after the respective trigger event. However, additionally occurring trigger events may be missed by the oscilloscope during the acquisition of a respective trigger event, namely when the pre-trigger memory section and/or the post-trigger memory section are/is filled. This results in an incomplete acquisition since the acquisition does not comprise all occurring trigger events.

In the continuous operation mode, the input signal is continuously acquired irrespective of any trigger events. However, the continuous acquisition fails to identify the trigger events in the input signal such that a post-processing is required which is time-consuming and needs a lot of computational power. In addition, the continuous operation mode might not be enabled to provide a real-time operation of the oscilloscope due to the time-consuming post-processing. Furthermore, the continuous acquisition requires a lot of memory capacity, which in turn results in high costs for the oscilloscope.

In order to overcome the above-mentioned drawbacks associated with the different operation modes of the respective oscilloscopes, a so-called ultra-fast acquisition mode is known that reduces a blind time between two trigger events by minimizing or even cancelling any post-processing and/or illustration of the data acquired. However, the ultra-fast acquisition mode cannot ensure that all post trigger events are acquired since it only reduces the blind time of the oscilloscope in which certain trigger events may be missed.

Accordingly, there is a need for a test and measurement instrument as well as a method that ensure reliable acquisition of all trigger events in a cost-efficient manner.

SUMMARY

The present disclosure provides examples of a test and measurement instrument. In an embodiment, the instrument includes a digitizer for digitizing an analog input signal, thereby generating a digitized input signal. In an embodiment, the test and measurement instrument also has a digital trigger for detecting a trigger event in the digitized input signal. Further, the test and measurement instrument comprises an acquisition memory for acquiring the digitized input signal at least segmentally upon a first trigger event detected by the digital trigger. The acquisition memory is configured to acquire a first signal segment prior to the first trigger event. The acquisition memory is further configured to acquire a second signal segment starting at the first trigger event. The length of the second signal segment is dynamically adjustable.

Further, the present disclosure provides examples of a method of analyzing an input signal by a test and measurement instrument. In an embodiment, the method comprises the steps of:

receiving an analog input signal;

digitizing the analog input signal, thereby generating a digitized input signal;

detecting a first trigger event in the digitized input signal;

acquiring a first signal segment in the digitized input signal prior to the first trigger event;

acquiring a second signal segment in the digitized input signal starting at the first trigger event; and adapting dynamically the length of the second signal segment acquired.

Accordingly, the length of the second signal segment is adjusted in a dynamic manner such that all post trigger events occurring can be acquired appropriately, thereby ensuring that no trigger events are missed. In other words, the blind time of the test and measurement instrument (with respect to post-trigger) is minimized or rather eliminated. The dynamic adjustment of the length of the second signal segment is done in an automatic manner such that no manual input is required, for example no manual input during the acquisition or rather prior to the acquisition by a certain setting of the test and measurement instrument.

Generally, the length of the second signal segment corresponds to the size of the second signal segment, wherein the size automatically adapts itself in an adaptive manner. In some embodiments, the size auto-adapts itself with respect to the input signal, namely in a variable and automatic manner.

An aspect provides that the length of the second signal segment depends on information associated with the digitized input signal. The respective information associated with the digitized input signal corresponds to the number of trigger events in the digitized input signal, for example a signal portion. Accordingly, it is ensured that all trigger events within the input signal can be acquired since the length of the respective segment, namely the size of the second signal segment, is adapted with respect to the number of trigger events in the digitized input signal. The dynamic adjustment means that any post-trigger events extend the length of the second signal segment.

The length of the second signal segment may depend on at least a second trigger event occurring during the acquisition of the second signal segment. The occurrence of at least one other trigger event, namely the second trigger event, extends the length of the second signal segment accordingly such that the second trigger event is also acquired, for example in a complete manner.

The complete acquisition of the second trigger event means that the respective trigger event is acquired in a similar manner as the first one with regard to the post trigger. Hence, the same amount of data or rather time past the respective trigger event is acquired, resulting in the extension of the length of the second signal segment.

Since the length of the second signal segment is extended, the respective size of the second signal segment is increased.

In some embodiments, the second trigger event ends the acquisition of a first sub-segment of the second signal segment while automatically starting the acquisition of a second sub-segment of the second signal segment, thereby dynamically extending the length of the second signal segment, wherein the second sub-segment starts at the second trigger event. Ending the first sub-segment and automatically starting the second sub-segment ensures that information concerning the second trigger event is automatically gathered. Furthermore, the start of the new sub-segment ensures that the second trigger event is acquired completely such that after the second trigger event a pre-defined amount of data is acquired (post-trigger acquisition).

For instance, the first sub-segment and the second sub-segment merge into each other at the second trigger event, resulting in a continuous second signal segment. The respective sub-segments are not spaced from each other as they merge seamlessly into each other, resulting in a continuous data acquisition that spans the second trigger event.

Another aspect provides that the first signal segment and the second signal segment merge into each other, resulting in a continuous signal portion acquired. The first and the second signal segments also seamlessly merge into each other, thereby providing a continuous data acquisition that spans the first trigger event.

In other words, the respective continuous data acquisition corresponds to a first time span prior to the respective trigger event as well as the second time span past the respective trigger event. Accordingly, the respective trigger event is acquired completely since information prior and post of the respective trigger event is acquired.

Furthermore, the digitized input signal may encompass several trigger events, wherein each trigger event is associated with a signal segment prior to the respective trigger event and a signal segment starting at the respective trigger event. The signal segments merge into each other at the respective trigger event, resulting in a continuous signal portion acquired. Several signal portions may be acquired that encompass data acquired seamlessly. Each of the different signal portions acquired may encompass at least one trigger event wherein information prior to the respective trigger event (pre-trigger acquisition) as well as information past the trigger event (post-trigger) are gathered. The information gathered past the first trigger event and the respective signal portion is variable due to the number of trigger events occurring in the respective time past the first trigger event occurring in the respective signal portion.

In some embodiments, several post-trigger events may occur during the post-trigger (acquisition), namely further trigger events when the signal segment starting at the respective trigger event is acquired, which enlarge the length of the second signal segment.

The different signal portions acquired may be spaced apart from each other, thereby ensuring that no continuous acquisition of the entire input signal occurs. Hence, the memory capacity can be reduced appropriately.

The acquisition memory may have a pre-trigger memory section for acquiring the first signal segment. The respective memory section associated with the pre-trigger is used to acquire the first signal segment, namely data acquired prior to the respective trigger event.

Furthermore, the acquisition memory may also have a post-trigger memory section for acquiring the second signal segment. The post-trigger memory section may have enough memory capacity in order to ensure the dynamic adaption for acquiring the second signal segment. As mentioned above, the second signal segment can be dynamically adjusted with respect to its length due to several trigger events occurring in short time, namely during the post-trigger of the first trigger event.

The post-trigger memory section may also by dynamically adjustable. Thus, the post-trigger memory section may be enlarged if necessary in order to ensure that the enlarged length of the second signal segment can be acquired completely.

In some embodiments, the post-trigger memory section may be enlarged upon detection of a second trigger event after the first trigger event. The second trigger event takes place during the post-trigger (acquisition). This means that the respective post-trigger acquisition has not yet stopped when the second trigger event occurs, thereby dynamically adjusting the length of the second signal segment.

A post-trigger counting may be restarted when detecting a second trigger event after the first trigger event. The post-trigger counting counts the time past or rather the amount of data that is acquired during the post-trigger (acquisition). Due to the restart of the post-trigger counting, the counting is restarted such that the length of the second signal segment is dynamically adjusted. The adjustment is done in an automatic manner since the post-trigger counting restarts the respective counting, thereby enlarging the overall time or rather amount of data acquired by the post-trigger (acquisition) of the initial trigger event, namely the first trigger event.

Another aspect provides that a default length of the second signal segment is provided. The default length of the second signal segment is associated with the post-trigger counting. In some embodiments, the default length defines the length or rather size of the post-trigger (acquisition) provided that no further trigger event occurs such that the post-trigger (acquisition) is stopped after the expiration of the default length.

However, the length of the second signal segment is enlarged with respect to the default length when the post-trigger counting is restarted. The post-trigger counting is restarted when a second trigger event is detected during the post-trigger counting or rather the post-trigger (acquisition) and prior to its expiration. The expiration of the trigger counting or rather the post-trigger (acquisition) means that the post-trigger counting has not expired or rather ended. Accordingly, the post-trigger counting defines the respective length or rather size of the second signal segment.

In some embodiments, the second signal segment is enlarged due to an occurrence of a second trigger event within the default length of the second signal segment. As mentioned above, the length is enlarged due to the occurrence of another trigger event within the time or rather length used by the post-trigger.

In some embodiments, the test and measurement instrument is an oscilloscope. Accordingly, a blind time of the oscilloscope is eliminated with regard to trigger events occurring in the post-trigger (acquisition).

In general, the pre-trigger memory section may already be filled when data is still acquired within the post-trigger memory section. Thus, the blind time may be further minimized or even eliminated since data associated with the input signal is already acquired in the pre-trigger (pre-trigger acquisition) for a trigger event that occurs directly after the post-trigger acquisition of the previous signal portion has ended. Such a trigger event would not enlarge the length of the second signal segment and, therefore, a pre-trigger blind time might occur that can be avoided appropriately.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
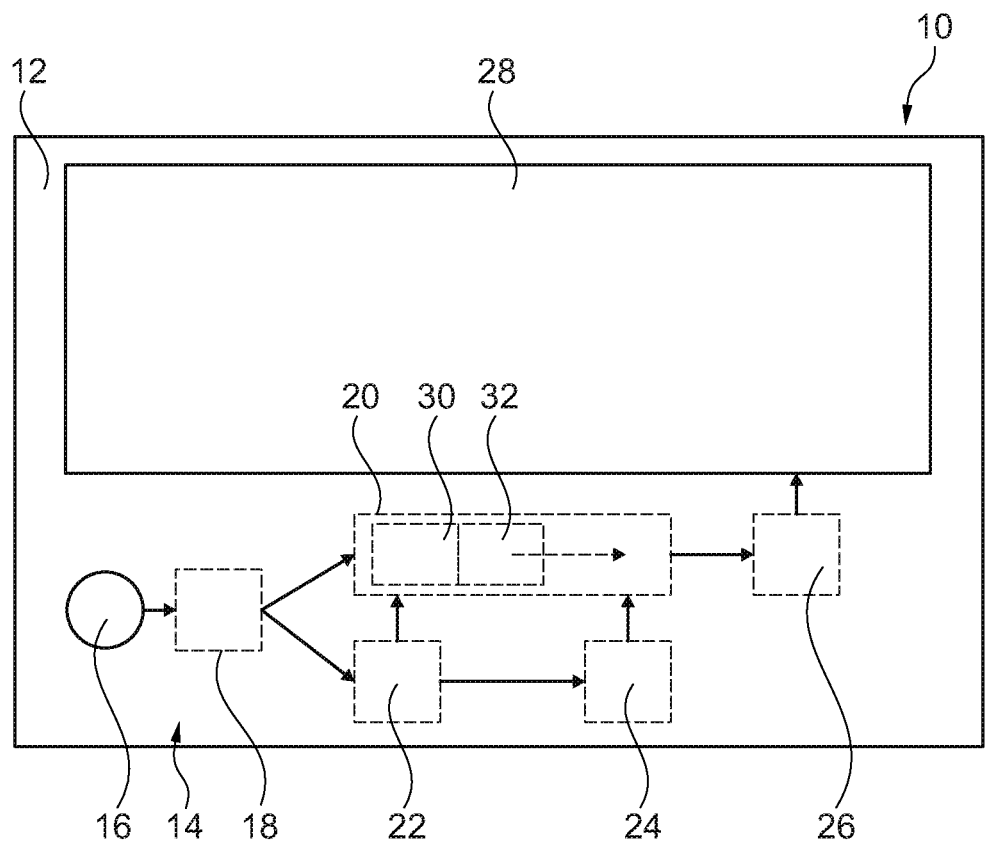
FIG. 1 schematically shows a test and measurement instrument according to an embodiment of the present disclosure.

In FIG. 1, a test and measurement instrument 10 is shown that is established by an oscilloscope. The test and measurement instrument 10 has a housing 12 at which a front end 14 is provided. The front end 14 comprises an input 16 that is used to be connected with a device under test. The device under test may provide an input signal that is processed by the test and measurement instrument 10.

The test and measurement instrument 10 also comprises a digitizer circuit 18 that is connected with the input 16 such that an analog input signal received via the input 16 is digitized accordingly. In an embodiment, the digitizer includes, for example, an analog-to-digital (A/D) converter circuit.

The digitizer 18 is also connected with an acquisition memory circuit 20 as well as a digital trigger circuit 22, wherein the digital trigger 22 is connected with the acquisition memory 20 as well as a trigger counter 24 which in turn is connected with the acquisition memory 20 as well. The acquisition memory 20 is connected with a post-processing circuit or module 26 that is connected with a display circuit or module 28.

The digitizer 18, the acquisition memory 20, the digital trigger 22, the trigger counter 24 and the post-processing module 26 correspond to internal components of the test and measurement instrument 10. Therefore, these components are illustrated by dashed lines in FIG. 1. In addition, these components may be established by hardware and/or software circuits or the like.

In general, the test and measurement instrument 10 internally processes the analog input signal received via the input 16 at the front end 14 such that a representative of the input signal as well as trigger events and/or other information related thereto are displayed for informing an operator of the test and measurement instrument 10.

Figure 2:
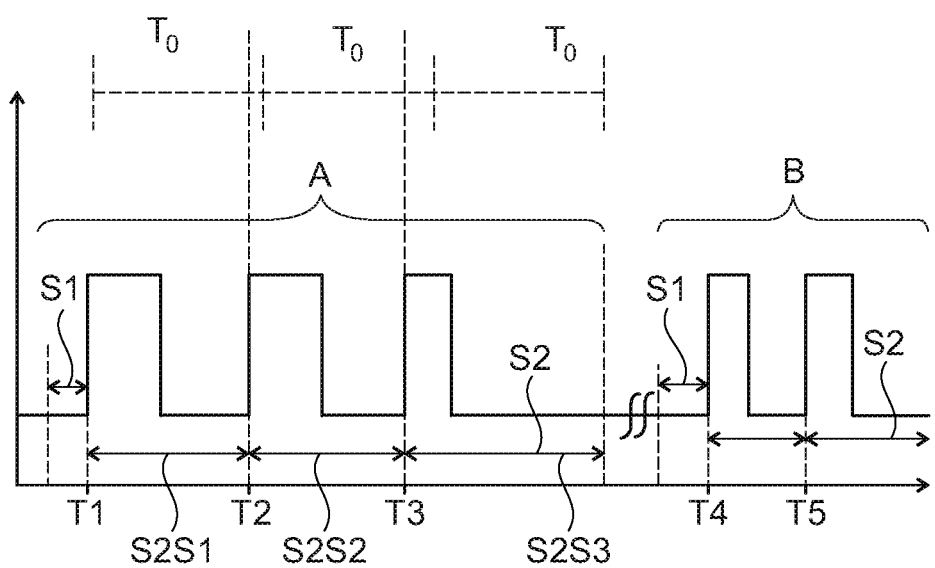
FIG. 2 schematically shows an overview of an example input signal encompassing several signal portions, signal segments as well as trigger events.

The data acquisition performed by the test and measurement instrument 10 will be described hereinafter in more detail while also referring to FIG. 2 illustrating a digitized input signal processed by the test and measurement instrument 10.

Accordingly, the analog input signal is received via the input 16 that forwards the analog input signal to the digitizer 18 that digitizes the analog input signal in order to generate a digitized input signal for further processing.

The digitized input signal is forwarded to the digital trigger 22 as well as the acquisition memory 20. The acquisition memory 20 generally comprises a first memory section 30, also called pre-trigger memory section, as well as a second memory section 32, also called post-trigger memory section. The acquisition memory 20 is configured to acquire different data associated with the input signal in the respective memory sections 30, 32 as will described later in more detail.

In any case, the first memory section 30, namely the pre-trigger memory section 30, is filled with acquired data in a continuous manner. This means that the pre-trigger memory section 30 is continuously filled with data acquired such that a certain amount of data is continuously stored in the pre-trigger memory section 30. Accordingly, new data gathered overwrites the oldest data stored in the pre-trigger memory section 30, resulting in a continuous acquisition of a certain data amount associated with the input signal.

Simultaneously, the digital trigger 22 processes the digitized input signal received as well in order to detect a trigger event in the digitized input signal.

When the digital trigger 22 detects a trigger event in the digitized input signal, the digital trigger 22 controls the acquisition memory 20 to start a post-trigger (acquisition) such that data associated with the digitized input signal is stored in the post-trigger memory section 32.

The data acquired prior to the trigger event is also called first signal segment, whereas the data acquired by the acquisition memory 20 after the trigger event is also called second signal segment.

In FIG. 2, a respective digitized input signal is shown that comprises several trigger events T1-T5. As mentioned above, the pre-trigger memory section 30 continuously acquires data, thereby acquiring the first signal segment S1 prior to the first trigger event T1, wherein the first signal segment S1 has a certain length or rather size.

When the first trigger event T1 occurs, the digital trigger 22 controls the acquisition memory 20 to acquire the second signal segment S2 which starts at the first trigger event T1. As shown in FIG. 2, those segments S1, S2 merge into each other in a seamless manner at the first trigger event T1, thereby providing a continuous signal portion A.

When the digital trigger 22 detects the first trigger event T1, the digital trigger 22 simultaneously controls the post-trigger counter 24 in order to start a post-trigger counting. This means that a certain time or a certain amount of data is counted by the post-trigger counter 24, which is called default length and indicated by $T_0$ in FIG. 2.

If the post-trigger counter 24 reaches the pre-defined end, namely the default length $T_0$, the post-trigger counter 24 controls the acquisition memory 20, for example the post-trigger memory section 32 to stop (post-trigger) acquisition of the digitized input signal. If, however, the digital trigger 22 detects another trigger event in the digitized input signal while the (post-trigger) acquisition is still ongoing, the digital trigger 22 restarts the post-trigger counter 24 such the post-trigger counting is restarted. Accordingly, the (post-trigger) acquisition is not stopped after the default length $T_0$, but enlarged by at least another default length $T_0$ as illustrated in FIG. 2.

In FIG. 2, a second trigger event T2 occurs within the default length $T_0$ following the first trigger event T1 such that the (post-trigger) acquisition was not stopped. A third trigger event T3 occurs within the default length $T_0$ following the second trigger event T2 such that the (post-trigger) acquisition was not stopped. However, no further trigger event occurs within the default length $T_0$ following the third trigger event T3 such that the (post-trigger) acquisition was stopped after expiration of the default length $T_0$, thereby acquiring the first signal portion A.

Accordingly, this results in a dynamic adjustment of the length of the second signal segment S2 since the post-trigger memory section 32 acquires more data than initially defined by the default length $T_0$ associated with the second signal segment S2.

In other words, the length of the second signal segment S2 is dynamically adjusted in an automatic manner due to information associated with the digitized input signal, namely trigger events following each other within a single signal portion, for example within the default length $T_0$ of a preceding trigger event, namely in the post-trigger acquisition of the preceding trigger event.

As mentioned above, the second trigger event T2 occurring during the acquisition of the second signal segment S2 after the occurrence of the first trigger event T1 triggers the dynamic adjustment of the length of the second signal segment S2.

In some embodiments, the second trigger event T2 ends the acquisition of a first sub-segment S2S1 of the second signal segment S2 while automatically starting the acquisition of a second sub-segment S2S2 of the second signal segment S2 that starts at the second trigger event T2. This dynamically extends the length of the second signal segment S2 while simultaneously ensuring that information concerning the second trigger event T2 is gathered.

In a similar manner, the third trigger event T3 ends the acquisition of the second sub-segment S2S2 of the second signal segment S2 while automatically starting the acquisition of a third sub-segment S2S3 of the second signal segment S2 that starts at the third trigger event T3. This dynamically extends the length of the second signal segment S2 while simultaneously ensuring that information concerning the third trigger event T3 is gathered.

The respective sub-segments S2S1-S2S3 merge into each other in a seamless manner, thereby defining the (continuous) second signal segment S2.

The first signal segment S1 associated with the pre-trigger acquisition and the second signal segment S2 associated with the post-trigger acquisition also merge into each other at the first trigger event T1 or rather the initial one, thereby defining the continuously acquired signal portion A. Accordingly, a continuous data acquisition of the respective signal portion A takes place.

In FIG. 2, the respective signal portion A encompasses three trigger events T1-T3 since two further trigger events T2, T3 occurred during the respective default length $T_0$ of the preceding trigger event, namely during the post-trigger acquisition.

The digitized input signal shown in FIG. 2 comprises two signal portions A, B acquired by the acquisition memory 20, wherein the respective signal portions A, B are separate ones as they are spaced from each other.

In some embodiments, the first trigger event T4 of the second signal portion B takes place after the default length $T_0$ expired during the acquisition of the first signal portion A, resulting in a stop of the acquisition of the first signal portion A. In other words, the post-trigger counting has expired as it was not restarted due to an occurring trigger event. This ensures that the oscilloscope is operated in a triggered operation mode rather than a continuous operation mode.

Furthermore, the respective signal portions A, B have a different length due to the different number of trigger events occurring in the post-trigger (acquisition) of the respective signal portions A, B.

This illustrates that the length of the second signal segment S2 of the respective signal portion acquired is dynamically adjusted wherein this depends on information associated with the digitized input signal, namely an occurring trigger event during the post-trigger (acquisition) or rather the number of trigger events occurring during the post-trigger (acquisition).

Hence, the post-trigger memory section 32 for acquiring the second signal segment S2 is also dynamically adjustable as illustrated by the dashed arrow in FIG. 1, as the post-trigger memory section 32 is dynamically enlarged upon detection of a further trigger event during the post-trigger acquisition of the first trigger event.

In general, FIG. 2 also illustrates that the digitized input signal encompasses several trigger events T1-T5, wherein each trigger event is associated with a previous signal segment, namely data prior to the respective trigger event, and a post signal segment, namely data starting at the respective trigger event.

In some embodiments, the test and measurement instrument 10 as well as the respective method ensure that no post-trigger event is missed, resulting in a reliable acquisition of the input signal.

Certain embodiments disclosed herein utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

In some examples, the methodologies and technologies described herein can be implemented by special purpose hardware-based computer systems or circuits, etc., or combinations of special purpose hardware and computer instructions.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A test and measurement instrument, the test and measurement instrument comprising:
   a digitizer for digitizing an analog input signal, thereby generating a digitized input signal;
   a digital trigger for detecting a trigger event in the digitized input signal; and
   an acquisition memory for acquiring the digitized input signal at least segmentally upon a first trigger event detected by the digital trigger,
   wherein the acquisition memory is configured to acquire a first signal segment prior to the first trigger event,
   wherein the acquisition memory is further configured to acquire a second signal segment starting at the first trigger event, wherein the length of the second signal segment is dynamically adjustable, and
   wherein the first signal segment and the second signal segment merge into each other, resulting in a continuous signal portion acquired such that a continuous data acquisition is provided that spans the first trigger event.

2. The test and measurement instrument according to claim 1, wherein the length of the second signal segment depends on at least a second trigger event occurring during the acquisition of the second signal segment.

3. The test and measurement instrument according to claim 2, wherein the second trigger event ends the acquisition of a first sub-segment of the second signal segment while automatically starting the acquisition of a second sub-segment of the second signal segment starting at the second trigger event, thereby dynamically extending the length of the second signal segment.

4. The test and measurement instrument according to claim 3, wherein the first sub-segment and the second sub-segment merge into each other at the second trigger event, resulting in a continuous second signal segment.

5. The test and measurement instrument according to claim 1, wherein the acquisition memory has a post-trigger memory section for acquiring the second signal segment.

6. The test and measurement instrument according to claim 5, wherein the post-trigger memory section is dynamically adjustable.

7. The test and measurement instrument according to claim 5, wherein the post-trigger memory section is enlarged upon detection of a second trigger event after the first trigger event.

8. The test and measurement instrument according to claim 1, wherein a default length for the second signal segment is provided.

9. The test and measurement instrument according to claim 8, wherein the second signal segment is enlarged due to an occurrence of a second trigger event within the default length of the second signal segment.

10. The test and measurement instrument according to claim 1, wherein the length of the second signal segment depends on information associated with the digitized input signal.

11. The test and measurement instrument according to claim 1, wherein the digitized input signal encompasses several trigger events, wherein each trigger event is associated with a signal segment prior to the respective trigger event and a signal segment starting at the respective trigger event, and wherein the signal segments merge into each other at the respective trigger event, resulting in a continuous signal portion acquired.

12. The test and measurement instrument according to claim 1, wherein the acquisition memory has a pre-trigger memory section for acquiring the first signal segment.

13. The test and measurement instrument according to claim 1, wherein a post-trigger counting is restarted when detecting a second trigger event after the first trigger event.

14. The test and measurement instrument according to claim 1, wherein the test and measurement instrument is an oscilloscope.

15. A method of analyzing an input signal by a test and measurement instrument, the method comprising:
   receiving an analog input signal;
   digitizing the analog input signal, thereby generating a digitized input signal;
   detecting a first trigger event in the digitized input signal;
   acquiring a first signal segment in the digitized input signal prior to the first trigger event;
   acquiring a second signal segment in the digitized input signal starting at the first trigger event; and
   adapting dynamically the length of the second signal segment acquired,
   wherein the first signal segment and the second signal segment merge into each other, resulting in a continuous signal portion acquired such that a continuous data acquisition is provided that spans the first trigger event.

16. The method according to claim 15, wherein the length of the second signal segment depends on information associated with the digitized input signal.

17. The method according to claim 15, wherein the digitized input signal is forwarded to a digital trigger and an acquisition memory.

18. A test and measurement instrument, the test and measurement instrument comprising:
   a digitizer for digitizing an analog input signal, thereby generating a digitized input signal;

a digital trigger for detecting a trigger event in the digitized input signal; and an acquisition memory for acquiring the digitized input signal at least segmentally upon a first trigger event detected by the digital trigger, wherein the acquisition memory is configured to acquire a first signal segment prior to the first trigger event, wherein the acquisition memory is further configured to acquire a second signal segment starting at the first trigger event, wherein the length of the second signal segment is dynamically adjustable, and wherein the first signal segment and the second signal segment seamlessly merge into each other in a seamless manner at the first trigger event, thereby providing a continuous signal portion that is acquired by the acquisition memory.

* * * * *